(12) United States Patent
Stevens et al.

(10) Patent No.: US 10,074,522 B1
(45) Date of Patent: Sep. 11, 2018

(54) SYSTEMS AND METHODS TO MAINTAIN OPTIMUM STOICHIOMETRY FOR REACTIVELY SPUTTERED FILMS

(71) Applicant: National Technology & Engineering Solutions of Sandia, LLC, Albuquerque, NM (US)

(72) Inventors: James E. Stevens, Albuquerque, NM (US); Patrick R. Mickel, Albuquerque, NM (US); Andrew Lohn, Santa Monica, CA (US); Matthew Marinella, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 370 days.

(21) Appl. No.: 14/671,284

(22) Filed: Mar. 27, 2015

Related U.S. Application Data

(60) Provisional application No. 61/971,301, filed on Mar. 27, 2014.

(51) Int. Cl.
*C23C 14/34* (2006.01)
*H01J 37/32* (2006.01)

(52) U.S. Cl.
CPC .... *H01J 37/32449* (2013.01); *C23C 14/3492* (2013.01)

(58) Field of Classification Search
CPC ................................................ C23C 14/0042
USPC .................................................... 204/192.13
See application file for complete search history.

(56) References Cited

U.S. PATENT DOCUMENTS

| 6,808,952 B1 | 10/2004 | Sniegowski et al. |
| 8,835,272 B1 | 9/2014 | Mickel et al. |
| 8,872,246 B1 | 10/2014 | Stevens et al. |

OTHER PUBLICATIONS

Ho, Diane Van, "The design and modification of a sputter system for DC reactive sputtering of alumina and zirconia thin films" (2011). LSU Master's Theses. 550.*
U.S. Appl. No. 13/780,285, filed Feb. 28, 2013, Henry et al.
U.S. Appl. No. 14/023,193, filed Sep. 10, 2013, Smith et al.
U.S. Appl. No. 14/462,472, filed Aug. 18, 2014, Lohn et al.
U.S. Appl. No. 14/612,958, filed Feb. 3, 2015, Mickel et al.
Bellido-Gonzalez V et al., "Reactive gas control of non-stable plasma conditions," *Thin Solid Films* 2006;502:34-9.
Berg S et al., "Modeling of reactive sputtering of compound materials," *J. Vac. Sci. Technol. A* 1987;5(2):202-7.
Dannenberg R et al., "Reactive sputter deposition of titanium dioxide," *Thin Solid Films* 2000;360:122-7.
Hmiel AF, "Partial pressure control of reactively sputtered titanium nitride," *J. Vac. Sci. Technol. A* 1985;3:592-5.

(Continued)

*Primary Examiner* — Rodney G McDonald
(74) *Attorney, Agent, or Firm* — Helen S. Baca; Martin I. Finston

(57) ABSTRACT

The present invention relates to systems and methods for preparing reactively sputtered films. The films are generally thin transition metal oxide (TMO) films having an optimum stoichiometry for any useful device (e.g., a sub-stoichiometric thin film for a memristor device). Described herein are systems, methods, and calibrations processes that employ rapid control of partial pressures to obtain the desired film.

4 Claims, 9 Drawing Sheets

(56) References Cited

OTHER PUBLICATIONS

Hsieh CI et al., "Forming-free resistive switching of $TiO_x$ layers with oxygen injection treatments," 2011 International Symposium on VLSI Technology, Systems and Applications (VLSI-TSA), Apr. 25-27, 2011, Hsinchu, Taiwan (2 pp.).

Hutchby J et al., "Assessment of the potential & maturity of selected emerging research memory technologies workshop & ERD/ERM working group meeting (Apr. 6-7, 2010)," Jul. 23, 2010 (55 pp.).

Jo SH et al., "Nanoscale memristor device as synapse in neuromorphic systems," Nano Lett. 2010;10(4):1297-301.

Kadlec S et al., "Hysteresis effect in reactive sputtering: a problem of system stability," J. Phys. D: Appl. Phys. 1986;19:L187 (4 pp.).

Larsson T et al., "A physical model for eliminating instabilities in reactive sputtering," J. Vac. Sci. Technol. A 1988;6:1832-6.

Lee HY et al., "Low power and high speed bipolar switching with a thin reactive Ti buffer layer in robust $HfO_2$ based RRAM," IEEE International Electronic Devices Meeting, 2008 (IEDM 2008), Dec. 15-17, 2008, San Francisco, CA (4 pp.).

Lee MJ et al., "A fast, high-endurance and scalable non-volatile memory device made from asymmetric $Ta_2O$/TaO bilayer structures," Nature Mater. 2011;10:625-30.

Lohn AJ et al., "A CMOS compatible, forming free $TaO_x$ ReRAM," ECS Trans. 2013;58(5):59-65.

Lohn AJ et al., "Analytical estimations for thermal crosstalk, retention, and scaling limits in filamentary resistive memory," J. Appl. Phys. 2014;115:234507 (7 pp.).

Lohn AJ et al., "Degenerate resistive switching and ultrahigh density storage in resistive memory," arXiv:1406.4033 [cond-mat. mtrl-sci], accessible from http://arxiv.org/abs/1406.4033 (15 pp.).

Lohn AJ et al., "Degenerate resistive switching and ultrahigh density storage in resistive memory," Appl. Phys. Lett. 2014;105:103501 (2014) (5 pp.).

Lohn AJ et al., "Dynamics of percolative breakdown mechanism in tantalum oxide resistive switching," Appl. Phys. Lett. 2013;103:173503 (4 pp.).

Lohn AJ et al., "Mechanism of electrical shorting failure mode in resistive switching," J. Appl. Phys. 2014;116:034506 (5 pp.).

Lohn AJ et al., "Memristors as synapses in artificial neural networks: Biomimicry beyond weight change," Chapter 9, Cybersecurity Systems for Human Cognition Augmentation, RE Pino et al. (eds.), Springer Int'l Publishing, Switzerland, 2014, pp. 135-150.

Lohn AJ et al., "Modeling of filamentary resistive memory by concentric cylinders with variable conductivity," Appl. Phys. Lett. 2014;105:183511 (5 pp.).

Lohn AJ et al., "Optimizing TaOx memristor performance and consistency within the reactive sputtering 'forbidden region'," Appl. Phys. Lett. 2013;103:063502 (4 pp.).

Lohn AJ et al., "Stages of switching in tantalum oxide memristor," IEEE Int'l Memory Workshop, held May 26-29, 2013 in Monterey, CA (4 pp.).

Martin N et al., "Enhanced sputtering of titanium oxide, nitride and oxynitride thin films by the reactive gas pulsing technique," Surf. Coat. Technol. 2011;142-144:615-20.

Miao F et al., "Continuous electrical tuning of the chemical composition of TaOx-based memristors," ACS Nano 2012;6(3):2312-8.

Mickel PR et al., "A physical model of switching dynamics in tantalum oxide memristive devices," Appl. Phys. Lett. 2013;102:223502 (5 pp.).

Mickel PR et al., "Detection and characterization of multi-filament evolution during resistive switching," Appl. Phys. Let.. 2014;105:053503 (4 pp.).

Mickel PR et al., "Isothermal switching and detailed filament evolution in memristive systems," Adv. Mater. 2014;26:4486-90.

Mickel PR et al., Supporting Information for "Isothermal switching and detailed filament evolution in memristive systems," Adv. Mater. 2014;26:4486-90 (8 pp.).

Mickel PR et al., "Memristive switching: Physical mechanisms and applications," Mod. Phys. Lett. B Apr. 2014;28(10):1430003 (25 pp.).

Mickel PR et al., "Multilayer memristive/memcapacitive devices with engineered conduction fronts," Eur. Phys. J. Appl. Phys. 2013;62:30102 (6 pp.).

Okamoto A et al., "Reactive sputtering characteristics of silicon in an $Ar-N_2$ mixture," Thin Solid Films 1986;137:143-51.

Otani Y et al., "Low power ReRAM with fab-friendly materials through PVD morphology and stoichiometry control," 2011 International Symposium on VLSI Technology, Systems and Applications (VLSI-TSA), conference date of Apr. 25-27, 2011 (2 pp.).

Raghavan N et al., "Statistical insight into controlled forming and forming free stacks for $HfO_x$ RRAM," Microelectron. Eng. 2013;109:177-81.

Schiller S et al., "Reactive D.C. sputtering with the magnetron-plasmatron for tantalum pentoxide and titanium dioxide films," Thin Solid Films 1979;63:369-75.

Schiller S et al., "Reactive high rate D.C. sputtering: Deposition rate, stoichiometry and features of $TiO_x$ and $TiN_x$ films with respect to the target mode," Thin Solid Films 1984;111:259-68.

Sproul WD et al., "Control of reactive sputtering processes," Thin Solid Films 2005;491:1-17.

Sproul WD, "High rate reactive sputtering process control," Surf. Coat. Technol. 1987;33:73-81.

Stevens JE et al., "Reactive sputtering of substoichiometric $Ta_2O_x$ for resistive memory applications," J. Vacuum Sci. Technol. A. 2014;32:021501 (6 pp.).

Strachan JP et al., "Spectromicroscopy of tantalum oxide memristors," Appl. Phys. Lett. 2011;98:242114 (3 pp.).

Strukov DB et al., "The missing memristor found," Nature May 1, 2008;453(7191):80-3 (erratum in: Nature Jun. 25, 2009;459(7250):1154).

Waser R et al., "Nanoionics-based resistive switching memories," Nat. Mater. 2007;6(11):833-40.

Waser R et al., "Redox-based resistive switching memories—Nanoionic mechanisms, prospects, and challenges," Adv. Mater. Jul. 2009:21:2632-63.

Wei Z et al., "Highly reliable $TaO_x$ ReRAM and direct evidence of redox reaction mechanism," IEEE International Electronic Devices Meeting, 2008 (IEDM 2008), Dec. 15-17, 2008, San Francisco, CA (4 pp.).

Wei Z et al., "Retention model for high-density ReRAM," 4th IEEE Int'l Memory Workshop (IMW), held on May 20-23, 2012 in Milan (pp. 1-4).

Wu X et al., "Chemical insight into origin of forming-free resistive random-access memory devices," Appl. Phys. Lett. 2011;99:133504 (3 pp.).

Yang JJ et al., Engineering nonlinearity into memristors for passive crossbar applications, Appl. Phys. Lett. 2012;100:113501 (4 pp.).

Yang JJ et al., "High switching endurance in $TaO_x$ memristive devices," Appl. Phys. Lett. 2010;97:232102 (3 pp.).

Yang JJ et al., "Memristive devices for computing," Nat. Nanotechnol. 2013;8(1):13-24.

Yang JJ et al., Supplementary Information for "Memristive devices for computing," Nat. Nanotechnol. 2013;8(1):13-24 (10 pp.).

Yang JJ et al., "Metal oxide memories based on thermochemical and valence change mechanisms," MRS Bull. Feb. 2012;37:131-7.

\* cited by examiner

SYSTEMS AND METHODS TO MAINTAIN OPTIMUM STOICHIOMETRY FOR REACTIVELY SPUTTERED FILMS

CROSS-REFERENCE TO RELATED APPLICATION

This application claims the benefit of U.S. Provisional Application No. 61/971,301, filed Mar. 27, 2014, which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to systems and methods for optimizing film stoichiometry and/or composition (e.g., in transition metal oxide films). In particular, the systems, methods, and calibration procedures herein employ rapid control of partial pressures to obtain the desired film stoichiometry.

BACKGROUND OF THE INVENTION

Memristor operation is strongly related to the stoichiometry of the device active layer. These devices operate in a small range of stoichiometries within which device performance is optimized. Unfortunately, the range of stoichiometries that yield operable devices is hard to reproducibly achieve using standard flow-control deposition in reactive sputtering (the most technologically relevant approach), and deposition parameters unpredictably change as the surface conditions inside the deposition chamber vary over time.

A major class of resistive memory devices (memristors, ReRAM, etc.) is based on transition metal oxide (TMO) films. In these films, mobile oxygen vacancies allow memory devices to exhibit multiple resistance states. The TMO stoichiometry determines the mobile oxygen vacancies, and thus the performance, of these devices. Reactive sputter deposition (RSD) is the most technologically relevant TMO deposition process. A major difficulty with RSD is that the optimum TMO stoichiometry occurs at an unstable operating point of the RSD tool.

Relevant TMO devices include $Ta_2O_5$-based devices, which have recently demonstrated impressive endurance and forming-free results. Deposition of sub-stoichiometric $Ta_2O_x$ (e.g., where x<5) films is a critical process in order to produce the required oxygen vacancies in some of these devices. Accordingly, there is a need for methods and apparatuses that provide reproducible films having controlled and optimized composition and/or stoichiometry.

SUMMARY OF THE INVENTION

The present invention relates to methods and apparatuses to control stoichiometry in active layers of devices. In particular embodiments, the invention includes an optimized physical vapor deposition (PVD) reactive sputtering process to deposit sub-stoichiometric TMO films (e.g., $Ta_2O_x$ films, where x<5). The desired film stoichiometry is achieved by feedback control of the oxygen partial pressure in the PVD chamber. Furthermore, a calibration procedure based on Rutherford Backscattering Spectroscopy (RBS) is described herein for locating the optimum oxygen partial pressure.

In addition, the present invention relates to a method for identifying invariant pressure-point landmarks in phase space. Depositing with partial pressure setpoints in terms of these landmarks makes it possible to precisely and reproducibly control the film stoichiometry and therefore device performance, even in the case of evolving chamber conditions. This method is likely to solve many of the reproducibility and consistency issues that are currently a problem in the memristor community.

In some embodiments, the invention relates to applying feedback control of the RSD process and/or controlling the oxygen partial pressure to produce the desired film stoichiometry.

In further embodiments, good process control depends on having a stable feedback reference over time.

In one aspect, the invention features a method for preparing a sub-stoichiometric transition metal film (e.g., transition metal oxide (TMO) film), the method including (i) increasing or decreasing reactive gas flow (e.g., $O_2$ flow) to a first flow rate in a deposition chamber, where the deposition chamber is configured to deposit the film on a surface (e.g., a surface for a memristive device); (ii) obtaining a first gas partial pressure measurement (e.g., first $O_2$ partial pressure measurement) at the first flow rate; (iii) obtaining a first gas feedback reference measurement (e.g., first $O_2$ feedback reference measurement) at the first flow rate, where step (ii) and (iii) can be conducted in any order or together; and (iv) repeating steps (i)-(iii) for an n number of times to obtain an $n^{th}$ gas partial pressure measurement (e.g., an $n^{th}$ $O_2$ partial pressure measurement) at an $n^{th}$ flow rate and an $n^{th}$ gas feedback reference measurement (e.g., an $n^{th}$ $O_2$ feedback reference measurement) at an $n^{th}$ flow rate, where n is an integer more than or equal to 1. In particular embodiments, n is from about 1 to 100 (e.g., from 1 to 50, 5 to 100, 5 to 50, 10 to 100, 10 to 50, 20 to 100, 20 to 50, or 50 to 100).

In some embodiments, the method further includes (v) determining a transition region in a first calibration curve, where the first calibration curve includes the first and $n^{th}$ gas partial pressure measurements as a function of the first and $n^{th}$ flow rates, and where the transition region indicates the presence of a sub-stoichiometric film and is bounded by a first gas partial pressure setpoint (e.g., a first $O_2$ partial pressure setpoint) and a second gas partial pressure setpoint (e.g., a second $O_2$ partial pressure setpoint); (vi) determining a first feedback reference setpoint corresponding to the first gas partial pressure setpoint, where the first feedback reference setpoint is determined by a second calibration curve including the first and $n^{th}$ gas feedback reference measurements as a function of the first and $n^{th}$ flow rates; and (vii) determining a second feedback reference setpoint corresponding to the second gas partial pressure setpoint, where the second feedback reference setpoint is determined by the second calibration curve and where step (vi) and (vii) can be conducted in any order or at the same time.

In further embodiments, the method includes (viii) depositing one or more transition metals on the surface in the deposition chamber at an experimental gas partial pressure (e.g., experimental $O_2$ partial pressure) that is measured to be between the first and second feedback reference setpoints, thereby preparing the sub-stoichiometric film on the surface. Exemplary reactive gases include oxygen (e.g., $O_2$), nitrogen (e.g., $N_2$), and fluorine (e.g., $F_2$).

In some embodiments, step (viii) further includes increasing or decreasing an experimental gas flow rate (e.g., experimental $O_2$ flow rate) to maintain the experimental gas partial pressure to be between the first and second feedback reference setpoints.

In some embodiments, the method further includes, before depositing step (viii), measuring film stoichiometry as a function of the first and $n^{th}$ gas feedback reference measurement.

In particular embodiments, each of the first and $n^{th}$ feedback reference measurements includes a gas optical emission measurement (e.g., an $O_2$ optical emission measurement). In further embodiments, the gas optical emission measurement is obtained from an optical emission gauge (e.g., any described herein). In some embodiments, the optical emission sensor is configured to respond to a change in $O_2$ partial pressure in the deposition chamber in less than about 250 milliseconds (e.g., less than about 200, 150, 100, 50, 25, 10, 5, or 1 ms).

In some embodiments, the transition region includes a plateau between the first and second gas partial pressure measurements (e.g., between the first and second $O_2$ partial pressure measurements).

The sub-stoichiometric film can have any useful composition, such as a transition metal oxide (e.g. $Ta_2O_x$ (e.g., where $3<x<5$), $TaO_x$ (e.g., where $x<2$), $TiO_x$ (e.g., where $x<2$), or $SrTiO_x$ (e.g., $x<3$)), as well as any described herein.

In another aspect, the invention features a system for preparing a transition metal oxide film, the system including a gauge for measuring $O_2$ partial pressure in a deposition chamber, where the gauge is an optical emission sensor and is configured to transmit one or more optical emission feedback reference measurements for the measured $O_2$ partial pressure; a feedback controller configured to receive one or more inputs and to transmit one or more outputs, where the one or more inputs include the one or more optical emission feedback reference measurements and the one or more outputs include an $O_2$ flow control signal; and an actuator for controlling flow of an $O_2$ source, where the actuator is configured to receive the one or more outputs from the feedback controller.

In some embodiments, the gauge is configured to respond to a change in $O_2$ partial pressure in the deposition chamber in less than 250 milliseconds (e.g., less than about 200, 150, 100, 50, 25, 10, 5, or 1 ms).

In some embodiments, the system further includes an optical filter and/or a lens configured to transmit the one or more optical emission feedback reference measurements of the gauge. In other embodiments, the system further includes a fiber optic cable configured to receive the one or more optical emission feedback reference measurements from the optical filter and/or lens and to transmit the optical emission feedback reference measurements as one of the one or more inputs for the feedback controller.

In some embodiments, the actuator is configured to transmit one or more signals to a valve that controls $O_2$ flow for the $O_2$ source.

Definitions

By "about" is meant +/−10% of the recited value.

By "sub-stoichiometric" is meant having an atomic composition that is lower than that dictated by stoichiometry (i.e., lower than an atomic composition required to satisfy the balanced chemical equation representing the given chemical reaction, given chemical product, or given chemical reactant). For example, for a titanium dioxide thin film, a stoichiometric film is an insulating $TiO_2$ film; and a sub-stoichiometric film is an oxygen deficient $TiO_x$ film, where $1<x<2$. In another non-limiting example, for a tantalum oxide thin film, a stoichiometric film is an insulating $Ta_2O_5$ film; and a sub-stoichiometric film is an oxygen deficient $Ta_2O_x$ film, where $3<x<5$. Further examples of such films are described herein.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

FIG. 3A is a schematic showing the relationship between $O_2$ flow and optical emission with $O_2$ partial pressure. FIG. 3B is a graph showing $O_2$ flow (diamonds, left hand axis) and $O_2$ optical emission signal (rectangle, right hand axis) versus $O_2$ partial pressure. "A" and "B" indicate setpoints, as described herein. FIG. 3C is a graph showing $Ta_2O_x$ stoichiometry parameter "x" versus $O_2$ feedback reference measurements from an optical emission sensor.

DETAILED DESCRIPTION OF THE INVENTION

Figure 1:
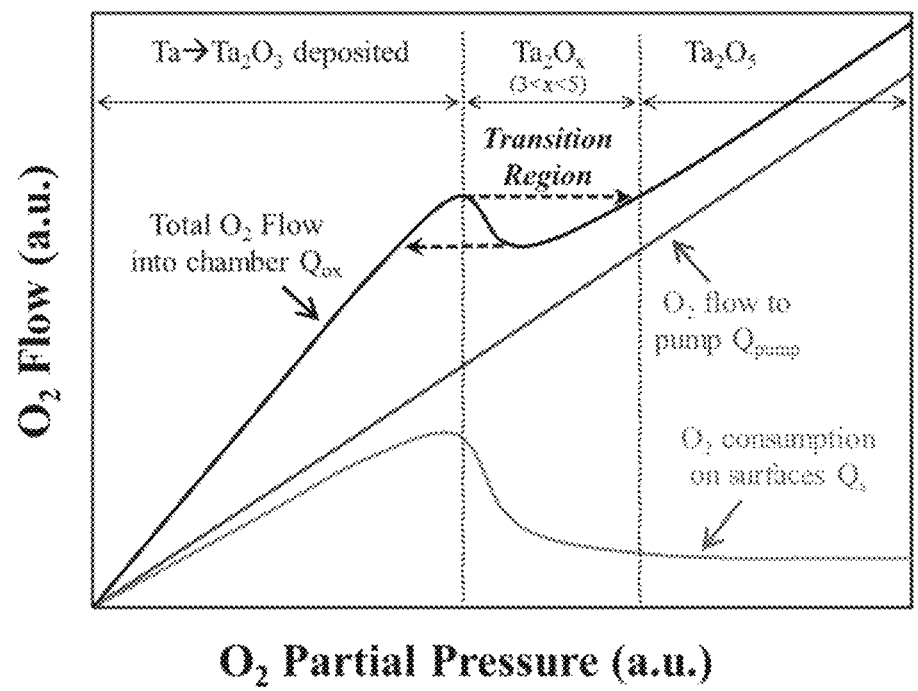
FIG. 1 is a graph showing idealized oxygen flows versus partial pressure for a non-limiting reactive sputtering process of the invention. As can be seen, the transition region indicates the optimum flow versus partial pressure to obtain a sub-stoichiometric $Ta_2O_x$ film, where $3<x<5$.

The present invention relates to systems, methods, as well as calibration procedures to prepare sub-stoichiometric TMO films. In particular, described herein are systems, methods, and calibration process to find the optimal $O_2$ partial pressure (or optimal range of pressures) that produces the desired film stoichiometry. Additional details are provided herein.

Systems for Preparing Sub-Stoichiometric Films

Hardware components can be used to control nonlinear reactive sputtering deposition processes. The present invention is directed to systems including various hardware components to fabricate RRAM and/or memristor devices. An exemplary system is provided in FIG. 2. The system 100 includes a feedback controller 110 connected to a gauge 120 and an actuator 140, such as a mass flow controller (MFC). The gauge 120 measures $O_2$ partial pressure in a process chamber for preparing the film. The actuator 140 controls the flow of $O_2$ into the process chamber. Optionally, an existing controller 300 provides a gate signal 350 by one or more relay lines 171, 173.

The feedback controller 110 is a unit capable of analyzing one or more inputs (e.g., gauge inputs) and providing one or more outputs (e.g., actuator outputs). Generally, the feedback controller 110 employs one or more control algorithms to analyze the input(s). Details of feedback controllers are provided below.

In general, the gauge 120 is capable of responding rapidly (e.g., less than about 1 millisecond) to a change in the $O_2$ partial pressure in the process chamber. For instance, the gauge 120 can be a Penning gauge, which has a rapid response time. The light discharged from the Penning gauge can be collected by a lens, transmitted through a filter 130 (e.g., a filter specific for detecting $O_2$ emission), and/or relayed by a fiber optic cable 135. In another instance, locating the gauge 120 near the process chamber can also minimize time lag and/or pressure difference between the measured pressure by the gauge and actual pressure in the process chamber. In use, the response from the gauge 120 is relayed as an input to the feedback controller 110.

In general, the actuator 140 is capable of responding rapidly to a flow control signal 145 from the feedback controller 110 by a relay line 172. Gate signal 350 opens isolation valves 165, 281 during the time the feedback actuator 140 is operating.

The system 100 is configured to interact with a sputter tool 200 and an existing tool controller 300 for that sputter tool. An exemplary sputter tool 200 includes a transition metal oxide (TMO) PVD chamber 225, other PVD chambers such as 220, a transfer chamber 210, wafer handler robots 250, mass flow controllers (MFC) for the tool 260, a gas supply 270 for one or more gases (e.g., $N_2$, Ar, and/or $O_2$), one or more valves for the gas supply 281-284, and one or more gas lines 291, 292. Additional details for exemplary sputter tools and tool controllers are provided herein.

The gauge 120 is configured to be mounted on the TMO PVD chamber 225, and the actuator 140 is configured to control the flow from the $O_2$ gas supply 270. In use, the optical signal from the gauge 120 acts as an input for the feedback controller 110, which provides an output $O_2$ flow control signal 145 that is relayed to the actuator 140. In this manner, the system 100 responds to fluctuations in the $O_2$ partial pressure in the PVD chamber 225 by providing enough $O_2$ from the gas supply 270 to maintain a constant $O_2$ pressure. Calibration procedures for determining the appropriate constant $O_2$ pressure or range of such pressures are described herein.

Physical Vapor Deposition Tool

The systems, methods, and calibration processes of the invention can be used in combination with a physical vapor deposition (PVD) tool to control nonlinear deposition processes. Exemplary PVD tools include a sputter tool (e.g., employing magnetron sputtering, gas flow sputtering, high-target-utilization sputtering, high-power impulse magnetron sputtering, ion-assisted deposition, ion-beam sputtering, or reactive sputtering), an electron beam evaporator machine, an electron beam PVD tool, an evaporative deposition tool, a cathodic arc deposition tool, and a pulsed laser deposition tool.

In general, a PVD tool includes an energy source (e.g., a high voltage direct current (HVDC) applied to an electrode, pulsed HVDC, an electric arc, a plasma discharge, a laser, an electron beam, etc.), a source material (e.g., a transition metal), and a deposition chamber configured to hold a substrate. Typically, the energy source interacts with the source material, thereby vaporizing the source material and facilitating deposition of the source material on the substrate. For instance, in a sputtering tool, the energy source is a high voltage, pulsed DC applied to the target electrode, which creates a glow plasma discharge confined by an array of magnets.

The PVD tool can include any number of useful features, such as one or more deposition chambers (e.g., deposition chamber(s), transfer chamber(s), etc.), one or more wafer handler robots, existing tool controllers, a gas supply (e.g., including an inert gas, such as Ar, and a reactive gas, such as $O_2$), one or more gas flow actuators (e.g., one or more MFCs), one or more valves, one or more gas lines, and/or one or more pumps.

Feedback Controller

The feedback controller is a unit configured to receive one or more inputs, such as $O_2$ optical emission feedback reference measurements, and apply one or more algorithms to determine whether the amount of a gas (e.g., $O_2$) in the system should be increased, decreased, or maintained. If the determination requires an increase or a decrease, then the feedback controller transmits one or more outputs, such as a gas flow control signal, which activates an actuator to open or close a valve or gas line connected to a gas supply. In this way, the feedback controller interacts with the gauge and actuator to maintain optimal partial pressure of the desired gas (e.g., $O_2$).

Exemplary inputs for the feedback controller include measured $O_2$ partial pressure, target voltage, plasma spectrum, etc. Exemplary outputs for the feedback controller include an $O_2$ flow control signal (e.g., with partial pressure control), a reactive gas flow signal, a target voltage, or a target power output.

The algorithm can include any useful parameters, such as one or more control loops (e.g., as in a pseudo-derivative feedback algorithm), time response(s), actuation times(s), voltage setpoint(s), etc. In particular embodiments, the algorithm features a digital variable structure control law that is able to maintain fast-acting and stable control, even when the actuator becomes fully open or closed. Exemplary algorithms and advanced multichannel reactive plasma gas feedback controllers are described in Bellido-Gonzalez V et al., "Reactive gas control of non-stable plasma conditions," *Thin Solid Films* 2006; 502:34-9, which is incorporated herein by reference in its entirety. Commercially available feedback controller systems include, for instance and without limitation, the Speedflo™ system from Gencoa Ltd., Liverpool, UK.

Gauges

The system, methods, and calibration processes of the invention employ one or more gauges to determine gas partial pressure in the deposition chamber. The gauge measures the gas partial pressure and provides a feedback reference measurement (e.g., an optical emission feedback reference measurement from an optical emission sensor). In particular, the gauge is one that responds rapidly to the $O_2$ partial pressure. Exemplary gauges include an optical emission sensor (OES) (e.g., a Penning gauge), a CCD, a lambda sensor, a baratron, etc., as well as any sensor having an accurate and rapid (<1 msec) response to changes in partial pressure.

Optionally, when an optical sensor is employed, a filter and/or a lens can be present between the sensor and the feedback controller. For instance, the filter can be employed to have cut-off value relevant to detecting $O_2$ (e.g., a 780±10 nm filter). In another instance, a collimating lens can be used to focus and transmit the optical signal from the sensor. For an optical sensor, a fiber optic cable can be used to transmit the signal from the sensor and the feedback controller.

Actuators

The system, methods, and calibration processes of the invention employ one or more actuators to control the flow rate of one or more reactive gases (e.g., $O_2$). An exemplary actuator includes a mass flow controller (MFC) having an input port, an output port, a mass flow sensor that measures flow between the input and output ports, and a control valve configured to be upstream of the output port and to respond to the output(s) of the feedback controller.

Calibration Procedures and Methods for Preparing Sub-Stoichiometric Films

Figure 3A:
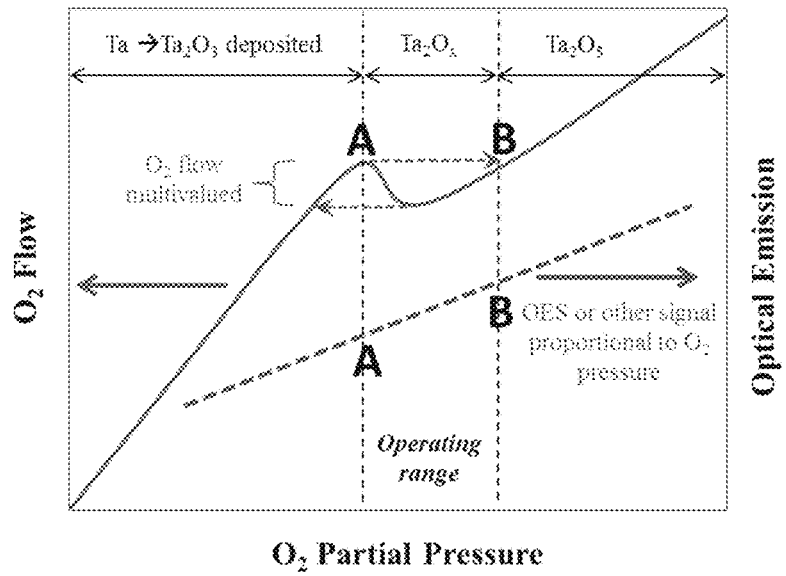
FIG. 3A-3C provides an exemplary method for calibrating systems of the invention.

The calibration procedures of the invention can be used to determine optimal partial pressure of a reactive gas (e.g., optimal $O_2$ partial pressure) that produces the desired film stoichiometry. FIG. 3A shows an idealized graph of partial pressure and the operating range [A-B] that produces a sub-stoichiometric film.

Figure 3B:
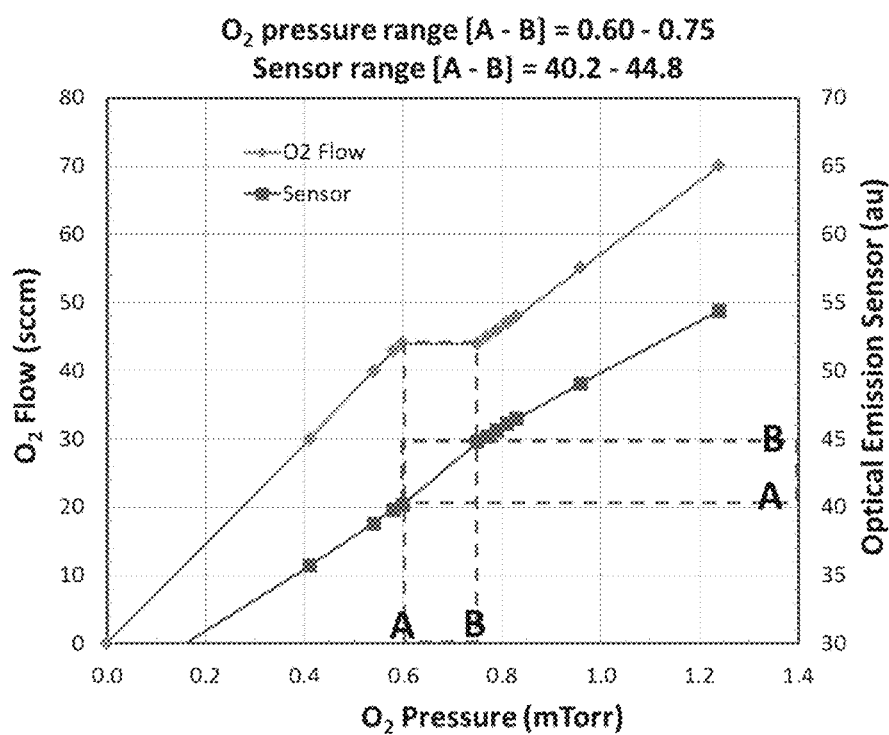

For instance, first, the calibration procedure can include generating a first calibration curve of reactive gas (e.g., $O_2$) flow rate in the deposition chamber versus measured reactive gas partial pressure by the gauge. This first calibration curve can be determined by gradually changing the flow rate of the reactive gas in the chamber by a particular amount and then recording the resultant partial pressure. Optionally, the feedback reference signal versus reactive gas pressure can be recorded while changing the flow rate in particular values. An exemplary first calibration curve and recorded feedback reference signal (from the optical emission sensor) is shown in FIG. 3B. Of course, the gradual change in flow rate can be an increase or a decrease by any useful value.

Second, the calibration procedure includes identifying the transition region, i.e., the region in the first calibration curve characterized by a plateau between two setpoints. For instance, as can be seen in FIG. 3B, the transition region in the $O_2$ calibration curve (diamonds in FIG. 3B) is the plateau between the two setpoints labeled A and B at about 0.6 and 0.75 mTorr, respectively. Notably, this transition region, which is determined by physical measurements of gas partial pressures and gas flow rate, represents a set of reaction conditions that provide desired sub-stoichiometric films. In this transition region, the plateau is controlled by the same process (i.e., complicated non-linear reactions and transition changes) that provides sub-stoichiometric films. The two setpoints determine the range of the feedback reference measurements (e.g., optical emission feedback reference measurements from an OEM) over the transition region.

Third, the procedure includes measuring the film stoichiometry as a function of the feedback reference measurements at the setpoints of the transition region for the initial experiment. An exemplary film stoichiometry curve is provided in FIG. 3C. This step is only needed the first time.

Finally, for subsequent experiments, only the first and second steps (i.e., generating a first calibration curve and identifying the transition region) can be performed. Then, if new setpoints are obtained when the first and second steps are repeated (e.g., due to sensor drift), then these new setpoints can be mapped to the film stoichiometry measurements obtained in the third step. Generally, a linear mapping is usually sufficient.

Figure 4:
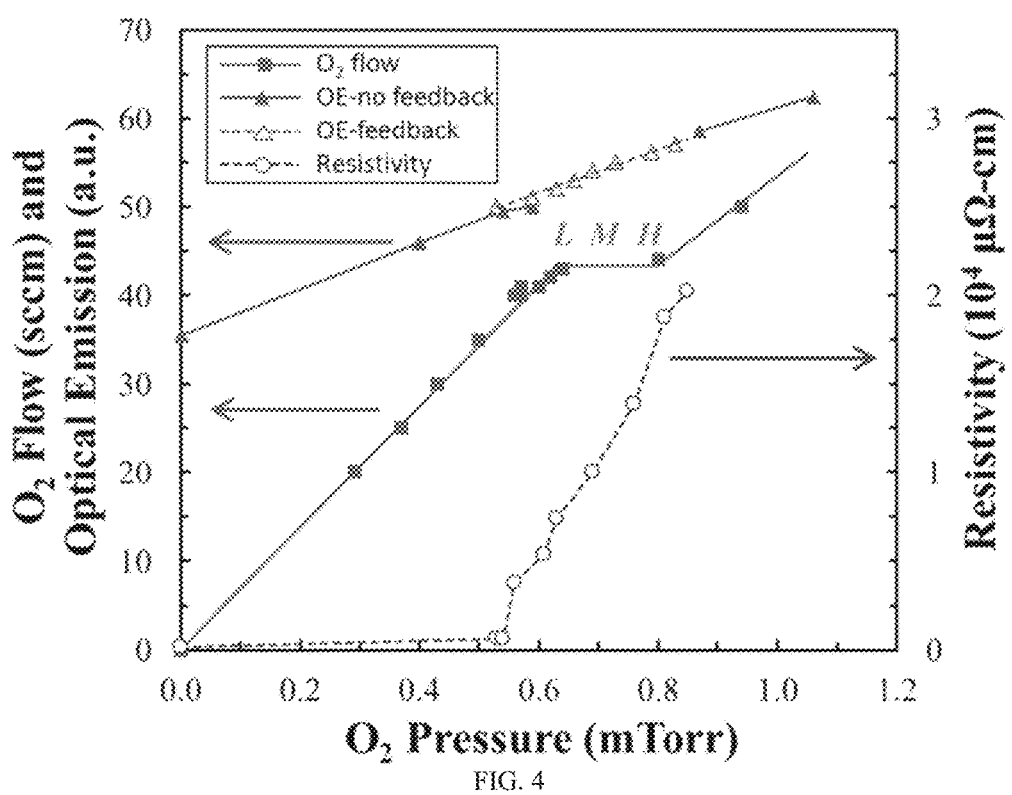
FIG. 4 is a graph showing $O_2$ flow (squares, left hand axis), 780 nm $O_2$ emission (OE, triangles, left hand axis), and $Ta_2O_x$ film resistivity (circles, right hand axis) versus $O_2$ partial pressure. The deposition conditions were 1 kW pulsed dc power, 155 sccm Ar flow, and 4.78 mTorr Ar pressure.

An exemplary calibration process is described herein for the reactive gas $O_2$. FIG. 4 provides an example calibration curve (squares) for $O_2$ flow versus $O_2$ partial pressure with $Ta_2O_x$ RSD. The optimum film stoichiometry occurs for $O_2$ pressures somewhere along the plateau in the curve between points L & H. This range of pressures is where the flow-controlled process is unstable and is labeled the "transition region." Feedback control, using $O_2$ optical emission as the feedback reference measurement, allows arbitrary $O_2$ partial pressures in the transition region to be maintained (FIG. 4, open triangles).

Figure 5:
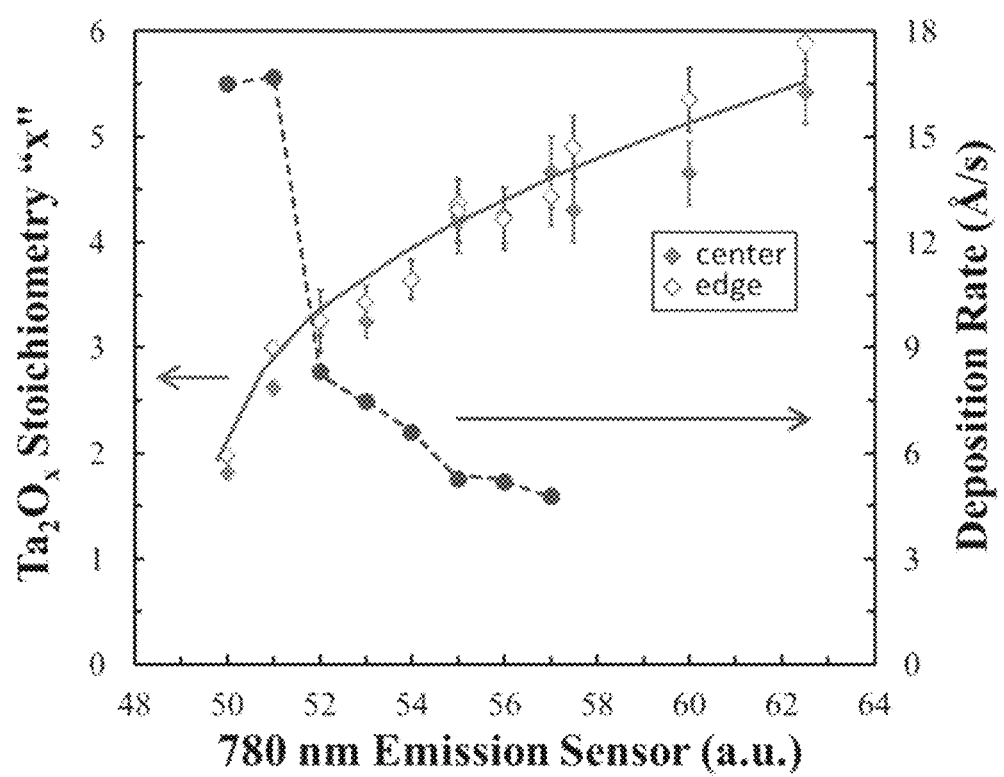
FIG. 5 is a graph showing $Ta_2O_x$ stoichiometry parameter "x" (diamonds, left hand axis) and deposition rate (circles, right hand axis) versus 780 nm $O_2$ emission (a.u.). Data from the wafer center (closed diamonds) and wafer edge (open diamonds) are included.

The stoichiometry of $Ta_2O_x$ films, measured by RBS, is plotted in FIG. 5 versus the feedback reference measurement using a 780 nm optical emission sensor. These measurements show that the oxygen content in the film increased continuously across the transition regime from $Ta_2O_3$ to $Ta_2O_{5+}$.

The problem addressed by this invention is that the partial pressure gauge calibration (e.g., a 780 nm optical emission in this case) can drift over periods of months. This drift could be due to coatings on the optical window, coatings on the chamber surfaces from running other processes, or many other reasons. Other oxygen partial pressure measurement techniques also will likely have calibration drift. Repeating the stoichiometry calibration (e.g., as in FIG. 5) is both time consuming and expensive. However, we have observed over many months that the $Ta_2O_x$ stoichiometry range between $3<x<4.5$ is identical to the $O_2$ pressure range of the "transition region" feature (FIG. 4), independent of the $O_2$ sensor drift. This is true because the same process that produces the transition region also controls the film stoichiometry. Thus, the transition region in the $O_2$ flow versus pressure curve serves as a landmark for film stoichiometry. The stoichiometry for the setpoints of the transition region (points L→H) are fixed, which in turn calibrates the feedback reference value (FIG. 4, open triangles).

A simple recipe can be set up to quickly generate the calibration curve in FIG. 4. The $O_2$ flow in this recipe can be increased in steps while the pressure and feedback reference measurements are determined and recorded. Small flow increments should be used around the plateau region. The resulting curve is the same as is obtained using a single wafer per condition, so long as the curve is taken with continuously increasing pressures to avoid hysteresis effects. A straight line fit to the slopes and to the plateau will then locate the transition region range in terms of the feedback reference signal. This procedure is a simple method to deposit stoichiometries in a traditionally unstable range while greatly reducing the time, effort and cost required to maintain calibration. It therefore ensures reproducibility in film deposition with minimal additional cost.

Sub-Stoichiometric Films

The systems, methods, and calibration processes of the invention can be used to control the stoichiometric composition in transition metal films. For instance, for transition metal oxide films, the systems and methods herein control the partial pressure and flow rate of the reactive gas $O_2$, and the transition metal can be any useful metal (e.g., any described herein).

Transition metals include any from Group 3-12 in the IUPAC periodic table of the elements. Exemplary transition metals include tantalum (Ta), titanium (Ti), hafnium (Hf), nickel (Ni), niobium (Nb), yttrium (Y), zirconium (Zr), chromium (Cr), molybdenum (Mo), tungsten (W), manganese (Mn), iron (Fe), cobalt (Co), copper (Cu), and zinc (Zn), optionally including one or more other metals, nanoparticles, or dopants, such as strontium (Sr), Cu, silicon (Si), aluminum (Al), Co, Cr, or barium (Ba). Exemplary sub-stoichiometric TMO films include tantalum oxide, such as $Ta_2O_x$ (e.g., where $3<x<5$) and $TaO_x$ (e.g., where $x<2$); titanium oxide, such as $TiO_x$ (e.g., where $x<2$) or $SrTiO_x$ (e.g., $x<3$); hafnium oxide, such as $HfO_x$ (e.g., where $x<2$); nickel oxide, such as $NiO_x$ (e.g., where $1<x<2$); copper oxide, such as $CuO_x$ or $Cu_xO$; tungsten oxide, such as $WO_x$ (e.g., where $x<3$); zirconium oxide, such as $ZrO_x$; molybdenum oxide, such as $MoO_x$; iron oxide, such as $FeO_x$; niobium oxide, such as $Nb_2O_x$ (e.g., where $3<x<5$) and $NbO_x$ (e.g., where $x<2$); chromium oxide, such as $CrO_x$; manganese oxide, such as $MnO_x$; cobalt oxide, such as $CoO_x$; zinc oxide, such as $ZnO_x$ (e.g., where $x<1$), as well as bilayers films thereof including any other useful film (e.g., $AlO_x$, $GaO_x$, $SiO_x$, $GeO_x$, $MgO$, $SnO_2$, $BiO_x$, $SbO_x$, $Ti$, $VO_x$ (e.g., where $x<2$), Pt, perovskites, as well as oxides of rare-earth metals, such as oxides of Ce, Sm, Gd, Eu, Pr, Er, Dy, and Nd).

Devices

The systems and methods of the invention can be employed to prepare any useful device or components thereof having a sub-stoichiometric film. Exemplary devices include a microelectronic device, such as a memristor device, a capacitor, a resistor, a memory cell, or a switching element; as well as one or more active layers in any device described herein.

Figure 6:
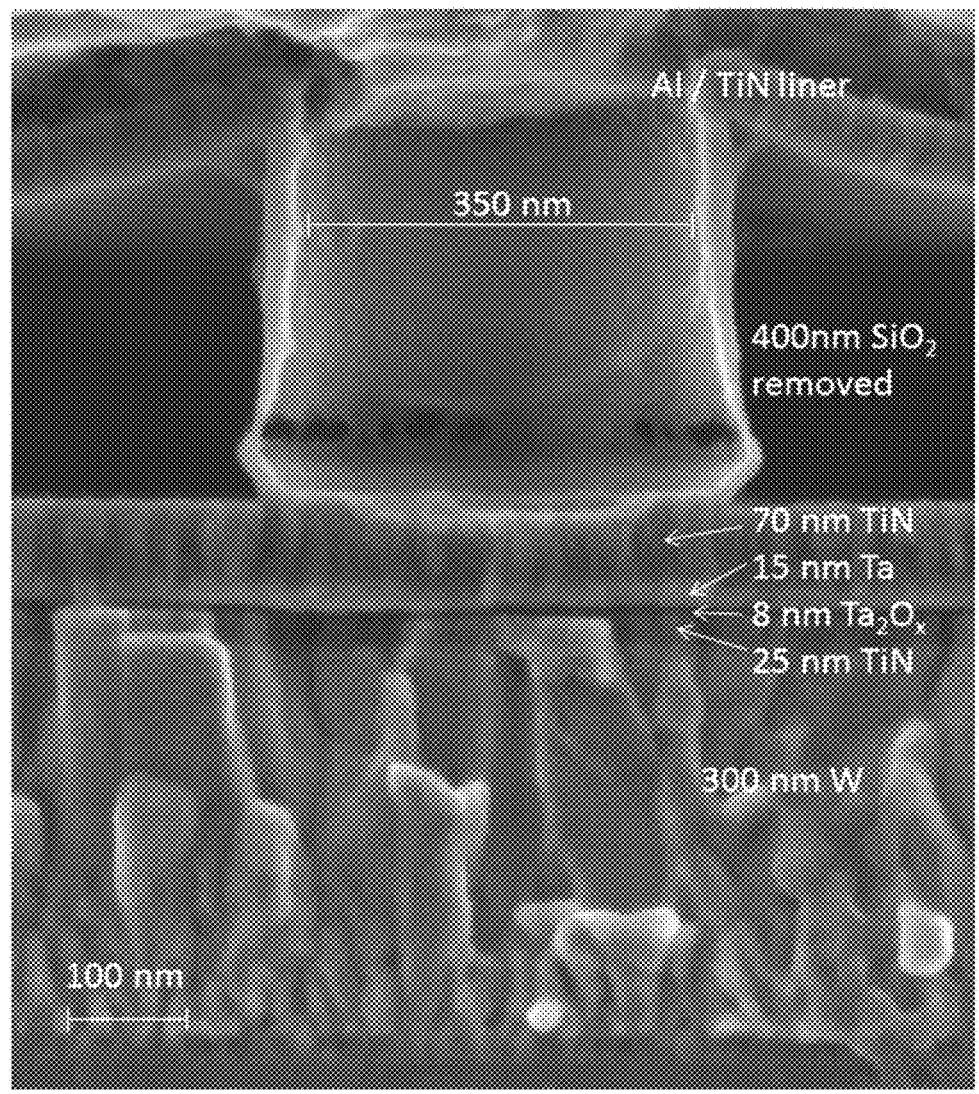
FIG. 6 is a scanning electron micrograph of a memristor device obtained by using an exemplary process of the invention.

Such sub-stoichiometric films can be used as an active layer in any useful device, such as a memristor device. In some embodiments, the memristor device includes a bottom electrode, a top electrode, an insulator layer disposed between the bottom and top electrodes, and a switching layer disposed beneath or above the insulator layer, where the switching layer includes a sub-stoichiometric film. In particular embodiments, the sub-stoichiometric film includes a metal oxide having a phase with less oxygen than a metal oxide included in an insulating layer. In other embodiments, the sub-stoichiometric film includes a metal oxide having mobile oxygen ions and/or oxygen vacancies (e.g., as compared to the metal oxide included in an insulating layer). FIG. 6 describes a non-limiting memristor device having a thin sub-stoichiometric film of an 8 nm $Ta_2O_x$ layer and an interfacial layer of a 15 nm Ta layer. Also shown are top and bottom TiN electrodes, a W layer on the Si substrate, and a 350 nm via.

The memristor device, as well as arrays thereof, can be fabricated by any useful process. Exemplary processes include those described in Lohn A J, "A CMOS compatible, forming free $TaO_x$ ReRAM cells and devices," *ECS Trans.* 2013; 58(5):59-65; U.S. Pat. Nos. 7,812,404, 6,952,030, and 5,915,167; and U.S. Pub. No. 2013-0126821, each of which is incorporated herein by reference in its entirety. Further exemplary methods of fabrication include microfabrication (e.g., by casting, injection molding, compression molding, embossing, ablation, thin-film deposition, and/or Computer Numerically Controlled (CNC) micromachining), deposition techniques (e.g., chemical vapor deposition, reactive sputtering physical vapor deposition, or atomic layer deposition), ion implantation techniques (e.g., to dope one or more metals in situ), annealing and/or quenching techniques, polishing techniques, photolithography, rapid prototyping, and etching techniques (e.g., wet chemical etching, reactive ion etching, inductively coupled plasma deep silicon etching, laser ablation, or air abrasion techniques).

EXAMPLES

Example 1: Systems and Methods for Preparing Sub-Stoichiometric Films

The present invention includes systems and methods for preparing sub-stoichiometric films for any useful purpose. In particular embodiments, the prepared sub-stoichiometric film forms the active layer for oxygen transport in a memristor device. Exemplary systems, methods, and calibration processes are described herein.

System

Figure 2:
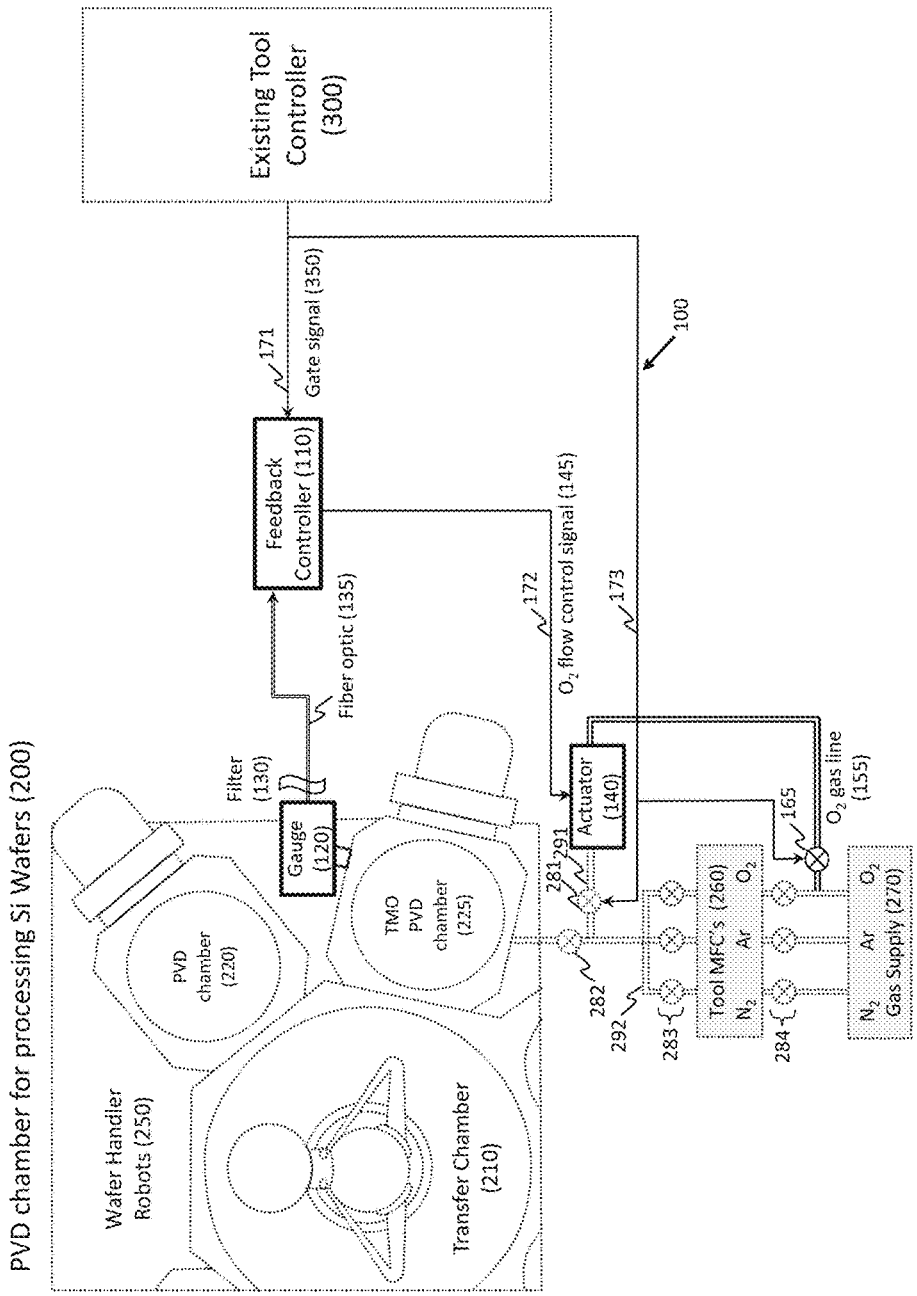
FIG. 2 is a schematic for an exemplary system 100 of the invention for preparing sub-stoichiometric transition metal oxides.

An exemplary system 100 is provided in FIG. 2, which interacts with a PVD sputter tool 200 and the existing controller 300 for that sputter tool. As can be seen, a gauge 120 measures $O_2$ partial pressure in the PVD chamber 225, where these feedback measurements are transmitted as an input for the feedback controller 110. Then, the feedback controller 110 analyzes this input and transmits an output (e.g., an $O_2$ flow control signal 145) to an actuator 140 that controls $O_2$ flow into the PVD chamber 225. In this manner, the system maintains the optimal $O_2$ partial pressure (as determined by the calibration processes described herein) during TMO deposition.

Calibration Process $Ta_2O$, $TiO_x$, and other transition metal oxide (TMO) based memristors need precisely controlled stoichiometry ("x") for the TMO layers. Such precise control is difficult, if not impossible, with standard flow-controlled reactive PVD because the $O_2$ flow versus $O_2$ pressure response (solid curve in FIG. 3A) is multivalued in the desired operating range [A to B] in FIG. 3A.

Many $O_2$ pressure sensors are not fast or accurate enough to provide a direct feedback reference signal. Optical emission can provide a fast, accurate feedback reference related to the $O_2$ pressure (dashed line in FIG. 3A), which in turn allows specific TMO stoichiometries such as $Ta_2O_x$ to be produced (curved line in FIG. 3C).

The calibration process includes locating the "landmark values" A and B for $O_2$ partial pressure (dashed vertical lines in FIG. 3B) and for the optical emission (dashed horizontal lines in FIG. 3B). We do this with an initial calibration run, during which the $O_2$ flow is increased in small steps while monitoring the $O_2$ partial pressure (diamonds in FIG. 3B) and the optical emission signal (squares in FIG. 3B). The $O_2$ partial pressure will exhibit a jump between the pressure values corresponding to points A and B. The optical emission sensor range [A to B] is then mapped from the optical emission sensor data (dashed horizontal lines, right hand axis, in FIG. 3B).

The calibration procedure is completed by measuring the film stoichiometry at the $O_2$ partial pressure points A and B and possibly at several other pressures near or inside the range [A-B]. This one-time calibration can be done with Rutherford Backscattering or other film analysis techniques.

Figure 3C:
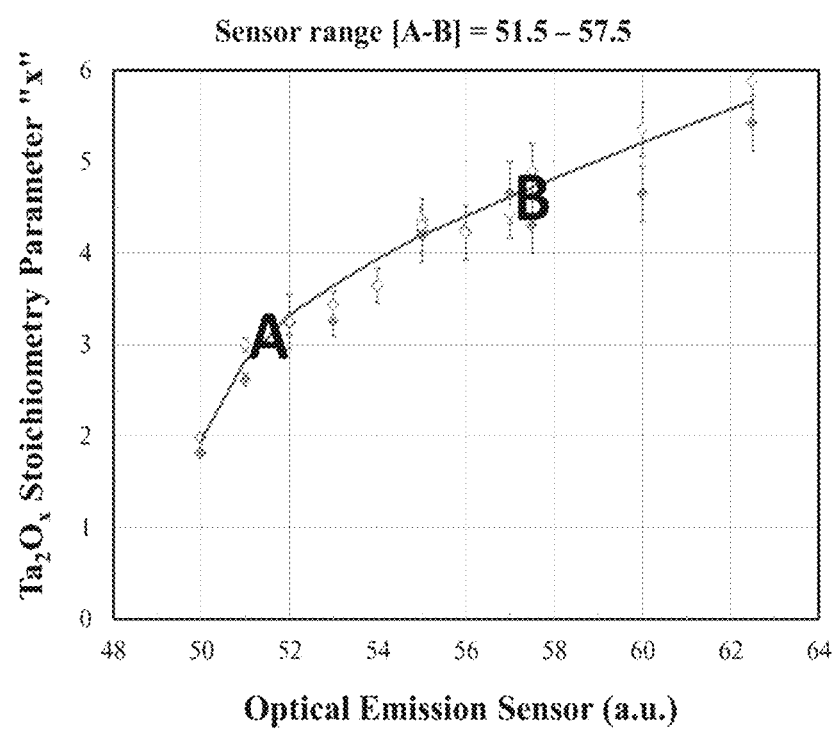

Note that the optical emission values for the range [A-B] in the FIG. 3B (40.2-44.8) are different than the values for [A-B] in FIG. 3C (51.5-57.5). This difference is because they were taken several months apart. There are week to week drifts in chamber conditions which is why a calibration procedure is necessary. After the emission setpoints A and B are determined, the film stoichiometry at setpoints A and B is always the same (A, x≈3.0 and B, x≈4.5). This is because the chamber conditions that generate the "jump" feature for the solid curve in FIG. 3A also determines the stoichiometry of the films (curved line in FIG. 3C). One may then linearly interpolate the required optical emission value to produce the optimum stoichiometry "x".

Example 2: Reactive Sputtering of Sub-Stoichiometric $Ta_2O_x$ for Resistive Memory Applications Introduction Resistive random access memories, also referred to as memristors or ReRAM, are two-terminal nonvolatile memory devices comprised of a thin semi-insulating film sandwiched between two conducting electrodes. Memristors are programmed to a high or low resistance state using on the order of one volt (≈1 MV/cm) and are read with voltages in the mV range.

Resistive memories are gaining attention as a possible replacement for nonvolatile flash memories due to excellent prospects for producing scalable, high-retention, high-endurance, and low-power devices (Strukov D B et al., "The missing memristor found," Nature 2008 May 1; 453(7191): 80-3 (erratum in: Nature 2009 Jun. 25; 459(7250): 1154); Waser R et al., "Redox-based resistive switching memories—Nanoionic mechanisms, prospects, and challenges," Adv. Mater. 2009 July; 21:2632-63). A recent report by the International Technology Roadmap for Semiconductors has identified resistive memory as one of the most promising emerging memory device technologies to replace flash (Hutchby J et al., "Assessment of the potential & maturity of selected emerging research memory technologies workshop & ERD/ERM working group meeting (Apr. 6-7, 2010)," Jul. 23, 2010) and potentially other types of random access memory. Their excellent analog behavior also makes the memristor device structure a viable candidate for neuromorphic computing (Jo S H et al., "Nanoscale memristor device as synapse in neuromorphic systems," Nano Lett. 2010; 10(4):1297-301).

Resistive memories can be divided into general categories based on their switching mechanism, including Electrochemical Metallization, Thermochemical Memory, and Valence Change Memory (VCM) (Waser R et al., Adv. Mater. 2009 July; 21:2632-63). VCM-based memristors, and $Ta_2O_5$ devices in particular, are especially interesting because they have demonstrated the highest endurance and longest retention to date (Lee M J et al., "A fast, high-endurance and scalable non-volatile memory device made from asymmetric $Ta_2O$/TaO bilayer structures," Nature Mater. 2011; 10:625-30; Yang J J et al., "High switching endurance in memristive devices," Appl. Phys. Lett. 2010; 97:232102). The switching layers in VCM memristors have been mostly transition-metal oxide (TMO) films such as $Ta_2O_5$, $TiO_2$, $SrTiO_3$, $HfO_2$, etc. Mobile oxygen ions and oxygen vacancies are responsible for the ability of these devices to exhibit multiple resistance states, although details of the switching mechanism vary with the material (Strukov D B et al., Nature 2008 May 1; 453(7191):80-3; Waser R et al., Adv. Mater. 2009 July; 21:2632-63; Lee H Y et al., "Low power and high speed bipolar switching with a thin reactive Ti buffer layer in robust $HfO_2$ based RRAM," IEEE International Electronic Devices Meeting, 2008 (IEDM 2008), Dec. 15-17, 2008, San Francisco, Calif.; Wei Z et al., "Highly reliable $TaO_x$ ReRAM and direct evidence of redox reaction mechanism," IEEE International Electronic Devices Meeting, 2008 (IEDM 2008), Dec. 15-17, 2008, San Francisco, Calif.). Memristor materials and processing choices may be further constrained by the requirements of integration with back-end complementary-metal-oxide-silicon (CMOS) circuits.

Deposition of sub-stoichiometric $Ta_2O_5$, i.e., $Ta_2O_x$, is a key process requirement (Miao F et al., "Continuous electrical tuning of the chemical composition of $TaO_x$-based memristors," ACS Nano 2012; 6(3):2312-8) for tantalum-oxide based memristor applications in order to produce the desired concentration of oxygen vacancies (i.e., doping) in the switching layer. These films may be deposited by physical vapor deposition (PVD) reactive sputtering, atomic layer deposition (ALD), or e-beam evaporation.

Here, we consider reactive sputter deposition, which is the most technologically relevant TMO deposition process. Reactive sputtering of a Ta target is accomplished in a pulsed dc magnetron source using a mixture of Ar and $O_2$. Argon ions do most of the sputtering of the metal target while the partial pressure of the reactive $O_2$ controls the oxygen content in the deposited film.

A major difficulty with reactive sputter deposition of $Ta_2O_x$ is that deposition tools generally control the $O_2$ flow rather than the $O_2$ partial pressure. Flow control results in either a metallic Ta-rich film or a pure $Ta_2O_5$ film being deposited. The desired sub-stoichiometric $Ta_2O_x$ cannot be obtained by a flow controlled process because its deposition conditions occur at an unstable operating point. This instability arises because the oxygen consumption by the target, wafer, and other chamber surfaces decreases significantly as the surface films change from metallic Ta to insulating $Ta_2O_5$ ("poisoning").

FIG. 1 shows an idealized plot of a reactive PVD process. The flow of oxygen into the chamber ($Q_{ox}$) equals the oxygen consumption on the metal surfaces ($Q_s$) plus the oxygen removed by the pump $Q_{pump} = CP_{ox}$ according to $Q_{ox} = Q_s + CP_{ox}$, where C is the chamber conductance or pumping speed and $P_{ox}$ is the oxygen partial pressure. The figure indicates the regions where metallic Ta-rich films, sub-stoichiometric $Ta_2O_x$, or pure $Ta_2O_5$ are deposited. The metal-insulator "transition" region, where sub-stoichiometric $Ta_2O_x$ can be deposited, is not accessible by flow control because of the nonlinear oxygen consumption by the Ta target and chamber/wafer surfaces in that pressure range. This is a well-known issue for reactive sputtering in general. Note that flow control results in a hysteresis effect, where the path taken depends on whether the $O_2$ pressure is increasing or decreasing as indicated by the dashed arrows in FIG. 1. We have labeled the jump with increasing $O_2$ pressure as the transition region, since going in the direction of decreasing pressure often suffers a large time lag as the $Ta_2O_5$ is slowly removed from the chamber surfaces.

Modeling (Kadlec S et al., "Hysteresis effect in reactive sputtering: a problem of system stability," J. Phys. D: Appl. Phys. 1986; 19:L187; Berg S et al., "Modeling of reactive sputtering of compound materials," J. Vac. Sci. Technol. A 1987; 5(2):202-7; Larsson T et al., "A physical model for eliminating instabilities in reactive sputtering," J. Vac. Sci. Technol. A 1988; 6:1832-6) based on the process pictured in FIG. 1 suggests that a large oxygen pumping speed relative to the surface consumption can reduce or eliminate this nonlinearity. This was demonstrated by Kadlec (Kadlec S et al., "Hysteresis effect in reactive sputtering: a problem of system stability," J. Phys. D: Appl. Phys. 1986; 19:L187) for a TiN process by increasing the system pumping speed, and by Okamoto (Okamoto A et al., "Reactive sputtering characteristics of silicon in an Ar—$N_2$ mixture," Thin Solid Films 1986; 137:143-51) by increasing the chamber conductance C. Reducing the target and substrate area will also reduce the oxygen surface consumption and thus reduce the nonlinearity (Larsson T et al., *J. Vac. Sci. Technol. A* 1988; 6:1832-6). Other methods have been suggested to reduce the nonlinear flow-control problem.

Some memristor experiments have used oxygen-rich targets of $Ta_2O_4$ and $Ti_4O_7$, where oxygen embedded in the target provides a measure of feedback that increases the $O_2$ flow when metal is being deposited and decreases the $O_2$ flow when oxide is being deposited (Yang J J et al., "Engineering nonlinearity into memristors for passive crossbar applications, *Appl. Phys. Lett.* 2012; 100:113501). The oxygen partial pressure may still vary for a given flow if wall conditions change or if the target composition is not repeatable.

Gas pulsing is another method that has been suggested to avoid the nonlinear flow-control problem (Martin N et al., "Enhanced sputtering of titanium oxide, nitride and oxynitride thin films by the reactive gas pulsing technique," *Surf Coat. Technol.* 2011; 142-144:615-20; Sproul W D et al., "Control of reactive sputtering processes," *Thin Solid Films* 2005; 491:1-17). Martin (Martin N et al., "Enhanced sputtering of titanium oxide, nitride and oxynitride thin films by the reactive gas pulsing technique," *Surf Coat. Technol.* 2011; 142-144:615-20) deposited $TiO_2$ by pulsing the $O_2$ on and off with a 16 sec period and a deposition rate of 2-12 Å/pulse. This method achieved sub-stoichiometric $TiO_2$ by essentially alternating Ti and $TiO_2$ layers a few atoms thick. However, reactive gas pulsing may not work if the chamber wall conditions vary with time.

Modeling by Larsson (Larsson T et al., "A physical model for eliminating instabilities in reactive sputtering," *J. Vac. Sci. Technol. A* 1988; 6:1832-6) suggested that low power might also improve process stability. Sproul showed reduced hysteresis for $ZrN_x$ using lower power (Sproul W D et al., "Control of reactive sputtering processes," *Thin Solid Films* 2005; 491:1-17). However, low power density tends to increase the process non-uniformity. PVD deposition tools that process medium to large wafer sizes (>150 mm) generally cannot avoid the nonlinearity in reactive-gas-flow versus pressure. These tools have large targets and surface areas and a fixed pumping speed.

Feedback control of the $O_2$ partial pressure is the most direct method to operate in the transition region and control the $Ta_2O_x$ stoichiometry (Hmiel A F, "Partial pressure control of reactively sputtered titanium nitride," *J. Vac. Sci. Technol. A* 1985; 3:592-5; Sproul W D, "High rate reactive sputtering process control," *Surf Coat. Technol.* 1987; 33:73-81). A fast acting mass flow controller (MFC) is used as the actuator to maintain the desired oxygen partial pressure. Feedback signals proportional to the oxygen partial pressure can be obtained from several sources including mass spectrometers, residual gas analyzers (RGA), baratron capacitive manometers, plasma optical emission (OE), DC power supply voltage, and film deposition rate. Most of these methods have been tried, and the choice comes down to convenience, expense, response time, and signal-to-noise. Sproul calculated that the overall system response from feedback signal to gas delivery needs to be less than 0.25 second (sec) (Sproul W D, "High rate reactive sputtering process control," Surf. Coat. Technol. 1987; 33:73-81).

Direct feedback on the reactive gas partial pressure from an RGA has been used by several authors (Schiller S et al., "Reactive high rate D.C. sputtering: Deposition rate, stoichiometry and features of $TiO_x$ and $TiN_x$ films with respect to the target mode," *Thin Solid Films* 1984; 111:259-68; Schiller S et al., "Reactive D.C. sputtering with the magnetron-plasmatron for tantalum pentoxide and titanium dioxide films," *Thin Solid Films* 1979; 63:369-75). High pressure RGA designs are needed for typical PVD operating pressures (1-20 mTorr). Baratron gauges respond to both the $O_2$ and Ar gases and the required oxygen control accuracy is typically ~0.02 mTorr, near the response limit of these gauges.

We found that our baratron gauge was satisfactory for measuring pressures over periods of seconds but too noisy as a feedback reference. The power supply voltage is convenient and responds rapidly to the oxygen partial pressure, but is multivalued in the transition region. Plasma optical emission, filtered for a Ti emission line, was used by Dannenberg (Dannenberg R et al., "Reactive sputter deposition of titanium dioxide," *Thin Solid Films* 2000; 360:122-7) to control $TiO_x$ deposition from a Ti target. A difficulty with using optical emission is that magnetron PVD tools often employ rotating magnets to maintain the discharge, which introduces a large, time-varying optical emission signal from the discharge chamber.

Experimental Setup

This work was done in a commercial single-wafer PVD tool capable of processing 150 or 200 mm wafers. The deposition chamber had a 320 mm diameter Ta target powered by a 5 kW pulsed DC power supply operated at 100 kHz. An array of permanent magnets rotating at 1.82 Hz was located above the target to provide plasma confinement and uniform deposition. Ar and $O_2$ MFCs supplied gas to the process. The process chamber volume was 4.6 liters and was pumped with a cryopump to a base pressure of $2\times10^{-8}$ Torr. The pumping speed for the chamber was approximately 440 l/s at an $Ar/O_2$ flow of 155/45 sccm. Chamber pressure was measured by a 100 mTorr baratron gauge. These experiments were carried out with a constant Ar flow, so the Ar contribution to the baratron measurement was assumed to be constant and changes in the measured baratron pressure were assumed to be due to $O_2$ partial pressure changes.

Feedback on the oxygen partial pressure was used for controlling the $Ta_2O_x$ stoichiometry. A commercial feedback control unit (Bellido-Gonzalez V et al., "Reactive gas control of non-stable plasma conditions," *Thin Solid Films* 2006; 502:34-9) monitored the oxygen optical emission signal and sent a control signal to an additional oxygen MFC. The MFC was mounted on the chamber through 250 mm of ¼" stainless steel tubing, close enough to reduce the time response of the feedback loop to 10's of msec. A supplemental signal from the tool was used to gate the feedback controller on and off for recipe steps that utilized oxygen feedback. The feedback system controlled the $O_2$ partial pressure to less than +0.014 mTorr within 5 sec after the process start. Typical $Ta_2O_x$ deposition steps lasted 14 to 40 sec for 5-15 nm thick films.

A Penning gauge mounted just off of the process chamber produced the plasma for the optical emission feedback signal. The gauge was located 100 mm from the chamber on a 20 mm ID port so that there was very little time lag or pressure difference between the Penning gauge pressure and the chamber pressure. This arrangement avoided the issue of directly viewing the plasma emission from the main discharge which varied as the magnets rotated. The plasma emission from the Penning gauge passed through a 780±10 nm filter and then into a fiber optic cable terminating in a photo-multiplier mounted in the feedback control unit. Oxygen emission at 777 nm along with several nearby Ar lines was detected. Since the Ar flow was held constant, we again assumed that changes to the plasma emission signal are due to $O_2$ partial pressures changes.

Results

Switching layer stoichiometry: Operating in the normal flow-controlled mode, the deposition rate for pure Ta was ~3150 Å/min using a process with 155 sccm Ar flow, 4.8 mTorr pressure, 5 kW of pulsed power, and a platen temperature between 25-50° C. The deposition rate for $Ta_2O_5$ was 150 Å/min in the "poisoned" regime, using $O_2$/Ar flows of 50/155 sccm, 5.7 mTorr pressure, and 1 kW of pulsed power. The result of a measurement of the $O_2$ flow versus oxygen pressure is shown in FIG. 4 (squares). A warm-up wafer was run just prior to each test wafer for each data point in order to condition the chamber walls. The $O_2$ flow versus $O_2$ partial pressure data in FIG. 4 exhibits a "plateau" or "transition region" in the $O_2$ pressure range of 0.63-0.80 mTorr. The low pressure end, midpoint, and high pressure end of the plateau are labeled L, M, and H for later discussion. The oxygen optical emission, in arbitrary units, is plotted versus oxygen partial pressure on the same axis (solid triangles). The optical emission signal jumped from 52 to 57 arbitrary units across that transition region, indicating a jump in $O_2$ partial pressure with no change in flow.

Feedback control allowed $O_2$ partial pressures in the range of 0.63-0.80 mTorr to be maintained. This range of $O_2$ pressures could not be achieved by standard flow control. The open triangles symbols in FIG. 4 show the optical emission versus pressure during a feedback controlled process using the 780 nm optical emission signal as the feedback reference. The 780 nm emission versus $O_2$ partial pressure is almost linear across the transition region.

Resistivity, based on 4-point probe measurements and scanning electron microscope (SEM) thickness measurements, is plotted on the right-hand axis of FIG. 4. The resistivity for pure Ta deposition was $\rho$=174 $\mu\Omega$-cm, consistent with beta-phase Ta. In the neighborhood of the transition region, the $Ta_2O_x$ resistivity increased by two orders of magnitude with increasing $O_2$ partial pressure. Above the transition region the deposited film became insulating.

Rutherford Backscattering Spectroscopy (RBS) by means of 2.0 MeV He$^+$ was used to measure the $Ta_2O_x$ film stoichiometry. FIG. 5 shows the stoichiometry of 30-50 nm thick $Ta_2O_x$ films measured by RBS, plotted versus the 780 nm optical emission signal level. The $Ta_2O_x$ films were deposited on p-type Si wafers for several optical emission control levels spanning the metal-insulator transition region. The wafers were etched in 100:1 HF for one minute just prior to the $Ta_2O_x$ film deposition in order to remove the native oxide. The RBS measurements shown in FIG. 5 indicated that the oxygen content in the film increased steadily across the transition regime from $Ta_2O_2$ to $Ta_2O5+$. The oxygen stoichiometry above 5 may be due to the remaining native oxide on the Si wafers or it may reflect extra oxygen embedded in the films (Strachan J P et al., "Spectromicroscopy of tantalum oxide memristors," *Appl. Phys. Lett.* 2011; 98:242114).

There was a small difference in stoichiometry between the wafer center and edge, which likely resulted from the radially localized gas input and the radially localized pumping of the chamber. The more insulating films formed in the neighborhood of the gas inlet and pump ports. This is consistent with four point probe resistivity measurements which showed up to a ±12% non-uniformity across the wafer while SEM measurements indicated a much more uniform $Ta_2O_x$ thickness.

The film deposition rate, plotted on the right hand axis of FIG. 5, was determined from SEM measurements. The deposition rate decreased rapidly above the low pressure end of the transition region (labeled "L" in FIG. 4), which is consistent with the discussion of FIG. 1.

The 780 nm optical emission signal was measured in arbitrary units, and it was found to drift over periods of months. This drift could be due to coatings on the optical window, coatings on the chamber surfaces from running other processes, or degradation of the Penning Gauge. Repeating the measurements of the film stoichiometry is both time consuming and expensive. However, several RBS data sets taken over a six month period showed that the $Ta_2O_x$ stoichiometry range between 3<x<4.5 was identical to the $O_2$ pressure range where the $O_2$ flow vs. $O_2$ pressure curve exhibits the "plateau" feature (FIGS. 1 and 4). This is because the plateau is caused by the same process that controls the film stoichiometry. Thus, the 780 nm oxygen emission signal needed for feedback control can be located by finding the plateau in the $O_2$ flow versus pressure curve.

Table I indicates the $Ta_2O_x$ stoichiometry versus position (L, M, H) along the plateau in FIG. 4 for our system. Note that the range of stoichiometry across the transition region is specific to our particular system and is further specific to the process conditions that were used (power, Ar flow, pumping speed, etc.). Our best functioning memristor devices were obtained on the high pressure side of the transition region (around point H), where the inferred stoichiometry was in the range $Ta_2O_{4.5}$-$Ta_2O_5$. This in turn provided the desired emission feedback target value (FIG. 4, open triangles).

TABLE 1

$Ta_2O_x$ stoichiometry versus position in transition region for the system

| Location along "plateau" (see FIG. 4) | $Ta_2O_x$ Stoichiometry |
| --- | --- |
| L: Lower pressure side | $Ta_2O_{3.0}$ |
| M: Middle | $Ta_2O_{3.8}$ |
| H: High pressure side | $Ta_2O_{4.5}$ |

A single recipe can be set up to generate a calibration curve similar to FIG. 4. The $O_2$ flow in this recipe was increased in 30 sec steps, while the pressure and 780 nm emission were measured and recorded. Small flow increments should be used around the plateau region. The resulting curve was the same as that obtained using a single wafer per condition and a chamber conditioning wafer between measurements. This holds so long as the curve is taken with continuously increasing pressures to avoid hysteresis effects. A straight line fit to the slopes and to the plateau will then locate the range of the transition region (points L, M, and H in FIG. 4) in terms of the 780 nm emission signal.

Device Fabrication Results:

This section describes one example where the reactive sputtering process of the previous section was used to fabricate $Ta_2O_x$-based memristor devices with a CMOS compatible process on Si wafers (Lohn A J, "A CMOS compatible, forming free $TaO_x$ ReRAM cells and devices," *ECS Trans.* 2013; 58(5):59-65). A reactive sputtering process was used to deposition $Ta_2O_x$ for individual memristor devices in a CMOS compatible lot flow on Si wafers. The memristor device stack consisted of a 20 nm TiN bottom electrode, a 5-15 nm $Ta_2O_x$ layer, a 15 nm Ta layer, and a 60 nm TiN top electrode, which were all sputter-deposited on top of a blanket tungsten layer.

The TiN/Ta/$Ta_2O_x$/TiN stack was deposited in two separate chambers of the PVD tool without breaking vacuum. Since the Ta and $Ta_2O_x$ were deposited in the same chamber, a warm-up wafer was run between those two depositions in order to condition the chamber for each process. The four-level memristor stack was etched to form 0.11 μm tall by 0.9 μm diameter single memristor devices. These devices were covered with a 400 nm SiO$_2$ inter level dielectric (ILD) layer. Vias with diameter of 0.35-1.0 μm were etched through the ILD and landed on the TiN top electrode of the memristor device. Finally, the vias were filled with sputtered TiN and aluminum which was patterned to provide electrical contact to the individual devices. FIG. 6 shows a SEM image of the deposited film stack for a single memristor device.

Figure 7:
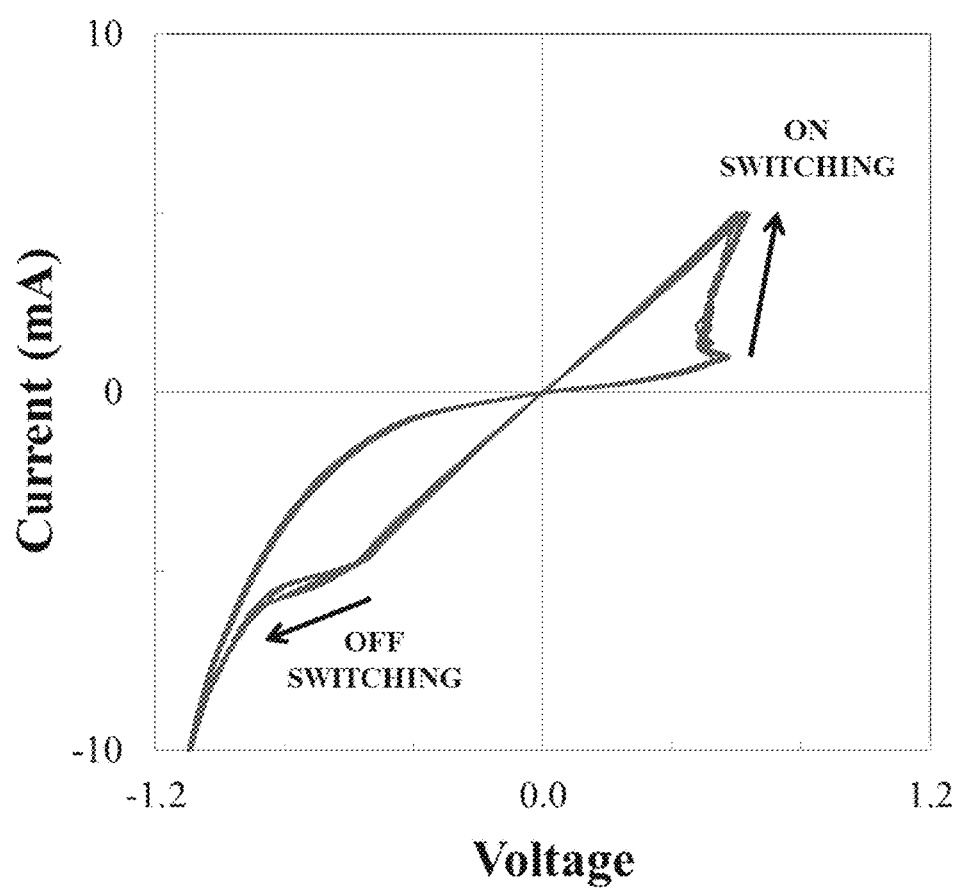
FIG. 7 is a graph of the memristor I-V curve showing four switching cycles. The voltages are applied to the top of the film stack described in the text.

Devices were fabricated with four Ta$_2$O$_x$ stoichiometries that spanned the high pressure half of the transition region (between pressures "M" and "H" in FIG. 4, or Ta$_2$O$_{3.8}$-Ta$_2$O$_5$). Devices fabricated with Ta$_2$O$_x$ from the high pressure end of the transition region (i.e., at or above pressure "H" in FIG. 4, or Ta$_2$O$_{4.5}$-Ta$_2$O$_5$) produced mostly working memristor devices. FIG. 7 shows the I-V response of a typical device with the voltage applied to the top of the film stack. Current-voltage testing of these devices exhibited the classical two-resistance-state ("bowtie" or "FIG. 8") memristor switching curves.

Figure 8:
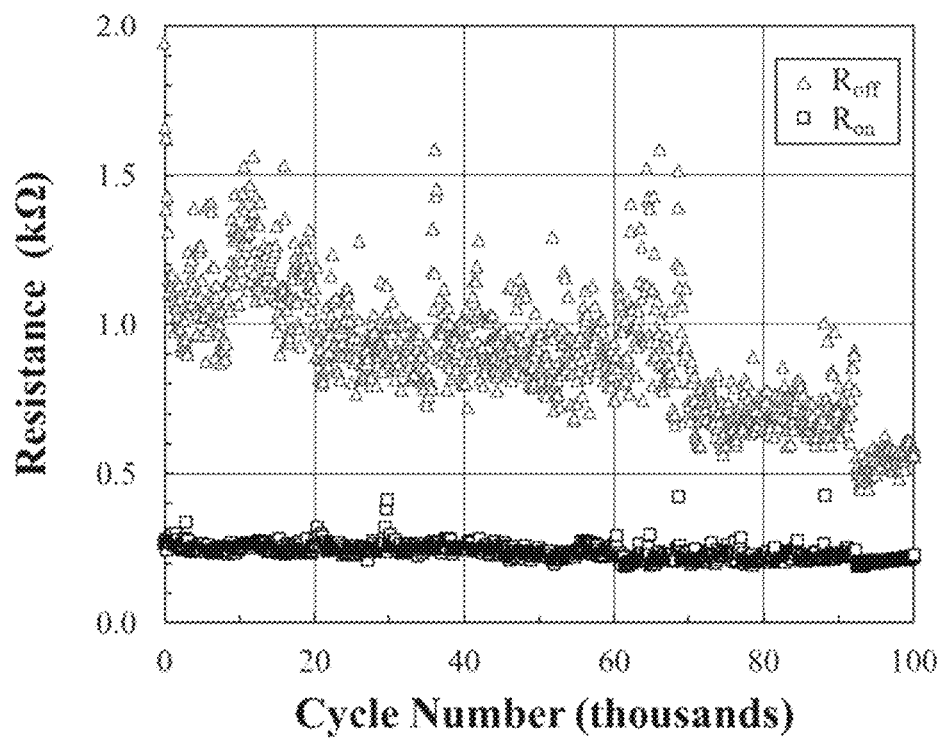
FIG. 8 is a graph showing off resistance ($R_{off}$, triangles) and on resistance ($R_{on}$, squares) for $10^5$ switching cycles of a single device. Every $100^{th}$ cycle was plotted.

Greater than 10$^5$ write/erase cycles were obtained for some devices. The resistivity was relatively linear for |V|<0.4 V, which is typical of Ta$_2$O$_x$ based devices. FIG. 8 shows the off and on resistances of a single device for 10$^5$ switching cycles. The Ta$_2$O$_x$ for this device was deposited at an O$_2$ pressure midway between "M" and "H" in FIG. 4. The off-state resistance, R$_{off}$, dropped from approximately 1200Ω to 500Ω after 9×10$^4$ write/erase cycles. The drop in R$_{off}$ appears to occur in several large steps at ≈15 k, ≈70 k, and ≈90 k cycles. The on-state resistance R$_{on}$ had less variability and decreased gradually from 250 to 200Ω over 10$^5$ cycles.

Memristor devices usually require an initial, relatively high voltage, forming step prior to settling into a repeatable I-V switching pattern at a lower voltage. The purpose of the forming step is to establish a nanoscale conducting filament through the Ta$_2$O$_x$ layer, the resistance of which can then be modulated by small movements of oxygen vacancies (Strachan J P et al., "Spectromicroscopy of tantalum oxide memristors," *Appl. Phys. Lett.* 2011; 98:242114). We observed no significant difference in electrical behavior for the range of stoichiometries studied here after these devices were electroformed. We expect that larger variations in stoichiometry, outside the range of "M"-"H," will eventually produce nonfunctioning devices but we do not have data for that extended range. Stoichiometry optimization is less important for the postforming electrical behavior because the state of the device is determined by the stoichiometry of the conducting filament instead of by the bulk as-deposited Ta$_2$O$_x$ stoichiometry.

These devices were forming free in the sense that they worked immediately at the 1 Volt write/erase voltage. Preliminary results indicate that the stoichiometry for optimum device performance and yield is dependent on other parameters in the fabrication and device design such as thermal budget and oxide thickness. For example, device yield increased with decreasing thickness from 15 nm to 5 nm at the high pressure end of the transition region. Increasing the oxygen content at the high pressure end of the transition region reduced the fraction of working devices, while reducing the ILD deposition temperature from 400° C. to 300° C. also reduced the fraction of working devices.

Stoichiometry optimization is much more important to the forming behavior of our devices than it is to the postforming electrical behavior. The forming process affects manufacturing concerns such as device-to-device consistency (Wu X et al., "Chemical insight into origin of forming-free resistive random-access memory devices," *Appl. Phys. Lett.* 2011; 99:133504) and yield (Hsieh C I et al., "Forming-free resistive switching of TiO$_x$ layers with oxygen injection treatments," 2011 International Symposium on VLSI Technology, Systems and Applications (VLSI-TSA), Apr. 25-27, 2011, Hsinchu, Taiwan). The forming voltage in our devices (~2.6-3.3 V) did not show a significant dependence on stoichiometry but the as-deposited resistance, and therefore the forming current and power, did. Once forming occurs and the conduction becomes localized to a nanoscale filament, the electrical power also becomes localized, which leads to immense heating (Lohn A J et al., "Dynamics of percolative breakdown mechanism in tantalum oxide resistive switching," *Appl. Phys. Lett.* 2013; 103:173503). Reducing this immense power density is the goal of improved electroforming (Raghavan N et al., "Statistical insight into controlled forming and forming free stacks for HfO$_x$ RRAM," *Microelectron. Eng.* 2013; 109:177-81) behavior as a means to improve consistency and yield.

Figure 9:
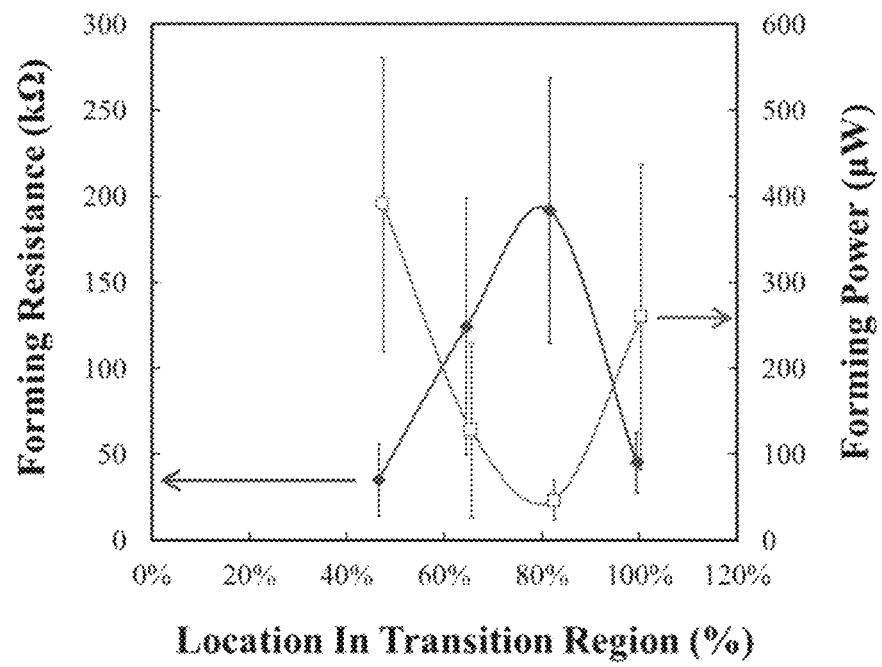
FIG. 9 is a graph showing forming resistance (kΩ, left hand axis) and forming power (μW, right hand axis) versus location in the transition region (%). The value 0% corresponds to the label "L," 50% corresponds to "M," and 100% corresponds to "H" in FIG. 4.

Films deposited at pressures near the low end of the transition region ("L") resulted in higher conductivity than those deposited at the higher ends (between "M" and "H"). By operating at the higher oxygen end of the stoichiometry range, it was possible to have higher as-deposited resistances and therefore lower forming power. This effect is shown in FIG. 9 where the as-deposited resistance is lower at the midpoint of the transition region than at the higher oxygen regions. The lowest forming powers occurred about 65%-82% of the way across the transition region (midway between locations "M" and "H") for our particular devices.

Other process and design parameters influence the electrical and forming behavior of memristor devices, including such factors as the post-deposition thermal budget, the switching layer thickness, and the various materials properties. Changes in these parameters will likely require recalibration of the as-deposited stoichiometry. The precision process described here enables deposition consistency and stoichiometry optimization as processes and designs vary.

Summary

Functional memristor devices based on Ta$_2$O$_5$ require the deposition of sub-stoichiometric Ta$_2$O$_x$ films for the active device layer. PVD sputter deposition tools that are designed to process medium to large wafers (>150 mm) have a nonlinear oxygen-flow versus oxygen-pressure curve in the regime where sub-stoichiometric Ta$_2$O$_x$ films can be produced. These tools require oxygen partial pressure control in order to produce sub-stoichiometric Ta$_2$O$_x$ films. Here, the Ta$_2$O$_x$ film composition, x, versus O$_2$ partial pressure was quantified by RBS and can be controlled continuously across the metal to insulator transition region by feedback on an O$_2$ optical emission signal. A stepped O$_2$-flow versus pressure measurement can be used to re-calibrate the optical emission sensor over the range of the transition region. CMOS compatible, Ta$_2$O$_x$ based, memristor devices were fabricated using this O$_2$ pressure-controlled reactive-sputtering process. The as-deposited stoichiometry did not play a large role in the electrical behavior of the devices, but it was important for the forming behavior of the devices. We expect that other sub-stoichiometric transition metal oxides can be deposited with a similar reactive sputtering process.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method for calibrating a plasma vapor deposition (PVD) tool for deposition of a transition metal oxide (TMO) film having a specified sub-stoichiometric composition, comprising:
   (a) stepping a rate of flow of reactive oxygen into a deposition chamber of the PVD tool through a range of flow-rate values,
   (b) obtaining a feedback reference measurement from a gauge at each of a plurality of the stepped flow-rate values, wherein the gauge provides feedback reference measurements indicative of a reactive oxygen partial pressure within the deposition chamber, and wherein the feedback reference measurements can be compared to a target value for feedback control of the TMO film;
   (c) identifying a transition region over which the feedback reference measurements exhibit a plateau as the reactive oxygen flow rate is varied, said plateau having a beginning at a first endpoint value of the reactive oxygen flow rate and an end at a second endpoint value of the reactive oxygen flow rate;
   (d) designating a first setpoint equal to the feedback reference measurement from the gauge at the first endpoint value of the reactive oxygen flow rate, and
   (e) designating a second setpoint equal to the feedback reference measurement from the gauge at the second endpoint value of the reactive oxygen flow rate;
   (f) accessing a predetermined mapping between accessible compositions of the TMO film and their corresponding positions on the range from the first setpoint to the second setpoint, the predetermined mapping being independent of any particular feedback reference measurements and independent of any particular reactive oxygen partial pressures;
   (g) from the mapping, selecting a position on the range from the first setpoint to the second setpoint that corresponds to the specified sub-stoichiometric composition;
   (h) from the designated first and second endpoints, predicting a feedback reference measurement value that corresponds to the selected position on the range from the first setpoint to the second setpoint; and
   (i) designating the predicted feedback reference measurement value as the target value for feedback control of the TMO film.

2. The method of claim 1, further comprising, before depositing the TMO film, measuring film stoichiometry as a function of a first and of a last feedback reference measurement.

3. The method of claim 1, wherein each of the feedback reference measurements comprises an $O_2$ optical emission measurement.

4. The method of claim 1, wherein the obtaining a feedback reference measurement from the gauge at each of a plurality of the stepped flow-rate value comprises obtaining the feedback reference measurements from a gauge that is configured to respond within less than 250 milliseconds to changes in oxygen partial pressure in the deposition chamber.

* * * * *